(12) United States Patent
Cheng

(10) Patent No.: US 6,964,898 B1
(45) Date of Patent: Nov. 15, 2005

(54) METHOD FOR FABRICATING DEEP TRENCH CAPACITOR

(75) Inventor: Chun-Wen Cheng, Hsin-Chu (KR)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/904,186

(22) Filed: Oct. 28, 2004

(51) Int. Cl.[7] .......................................... H01L 21/8242
(52) U.S. Cl. ...................................... 438/243; 438/386
(58) Field of Search ................................ 438/243–249, 438/386–392

(56) References Cited

U.S. PATENT DOCUMENTS 6,838,334 B1   1/2005  Gluschenkov et al. ...... 438/243

*Primary Examiner*—Jack Chen
(74) *Attorney, Agent, or Firm*—Winston Hsu

(57) ABSTRACT

A method for fabricating a trench capacitor is disclosed. A substrate is etched to form a first trench recess with a first depth. A spacer layer is deposited on interior surface of the first trench recess. The spacer layer is anisotropic etched back to form a spacer on sidewall of the first trench recess, and through the first trench recess, continuing to etch the substrate so as to form a second trench recess with a second depth. A silicon oxide layer is formed on interior surface not covered by the spacer within the second trench recess. The silicon oxide layer is then anisotropic etched to form a self-aligned collar oxide layer on sidewall of the second trench recess. Through the second trench recess, etching continues to remove the substrate to form a deep trench recess with a third depth. The deep trench recess is thereafter doped to form a diffusion region at a lower portion of the deep trench recess. A capacitor dielectric layer is then formed under the self-aligned collar oxide layer on interior surface of the deep trench recess. The deep trench recess is filled with a first conductive layer. The first conductive layer is then recess etched to form a first conductive stud within the deep trench recess. The first conductive stud has a top surface that is lower than the surface of the substrate, but is higher than the self-aligned collar oxide layer.

22 Claims, 25 Drawing Sheets ced glass (BSG) layer 16 is formed

METHOD FOR FABRICATING DEEP TRENCH CAPACITOR

BACKGROUND OF INVENTION

1. Field of the Invention

The present invention relates to a process for fabricating a semiconductor device. More particularly, the present invention relates to a process for fabricating a deep trench capacitor of a dynamic random access memory (DRAM) device, in which the collar oxide of the deep trench capacitor is thermally formed prior to the formation of the first polysilicon deposition and the first recess etch thereof. According to the preferred embodiment of the present invention, only two CVD polysilicon deposition steps are involved during the fabrication of the trench capacitor, such that the fabrication process is simplified.

2. Description of the Prior Art

As the size of a memory cell shrinks, the chip area available for a single memory cell becomes very small. This causes reduction in capacitor area and therefore becomes a challenge for chip manufacturers to achieve adequate cell capacitance. Trench-capacitor DRAM devices are known in the art. A trench-storage capacitor typically consists of a very-high-aspect-ratio contact-style hole pattern etched into the substrate, a thin storage-node dielectric insulator, a doped low-pressure chemical vapor deposition (LPCVD) polysilicon fill, and buried-plate diffusion in the substrate. The doped LPCVD silicon fill and the buried plate serve as the electrodes of the capacitor. A dielectric isolation collar in the upper region of the trench prevents leakage of the signal charge from the storage-node diffusion to the buried-plate diffusion of the capacitor.

Please refer to FIG. 1 to FIG. 11. FIG. 1 to FIG. 11 are schematic cross-sectional diagrams showing the fabrication process of the trench capacitor DRAM according to the prior art. As shown in FIG. 1, firstly, deep trench structures 11 are formed in the semiconductor substrate 10. The formation of deep trenches is known in the art. For example, a hard mask stack consisting of a pad oxide layer 12, a pad nitride layer 14, and a thick borosilicate glass (BSG) layer 16 is formed on a main surface of the semiconductor substrate 10. Thereafter, a conventional lithographic technique and etching process such as reactive ion etching are carried out to form the deep trench structures 11.

As shown in FIG. 2, after removing the remaining BSG layer 16, an arsenic silicate glass (ASG) layer 22 is deposited on the interior surface of the deep trench structures 11. The ASG layer 22 is also deposited on the pad nitride layer 14. A photoresist layer 24 is then formed at the lower portion of each deep trench structure 11. To form the photoresist layer 24, a layer of photoresist is coated on the substrate 10 and fills the deep trench structures 11. The photoresist is then etched back. The ASG layer 22 that is not covered by the photoresist layer 24 is removed from the sidewalls of the deep trench structures 11 and from the surface of the pad nitride layer 14.

As shown in FIG. 3, a thermal process is carried out to drive dopants such as arsenic from the ASG layer 22 into the adjoining substrate 10, thereby forming a buried $N^+$ diffusion plate 25, which serves as a first electrode of the deep trench capacitor. Thereafter, the photoresist layer 24 and the ASG layer 22 are removed by methods known in the art.

As shown in FIG. 4, a capacitor dielectric layer 27 such as an oxide-nitride (ON) or an oxide-nitride-oxide (ONO) dielectric film is formed on the interior surface of the deep trench structures 11. A first polysilicon layer 29 is then formed in the substrate 10. The first polysilicon stud 29 has a top surface that is much lower than the surface of the substrate 10. To form the first polysilicon stud 29, a layer of CVD polysilicon layer is deposited on the substrate 10 and fills the deep trench structures 11. The CVD polysilicon layer (not shown) is then etched back to form a recess at the upper portion of each deep trench structure 11. This process is also referred to as first poly deposition and recess etching process. The exposed capacitor dielectric layer 27, which is not covered by the first polysilicon stud 29, is then removed.

As shown in FIG. 5, a collar oxide layer 32 is then formed on the upper sidewalls of the deep trench structures 11 above the first polysilicon stud 29. A second poly deposition and recess etching process is carried out to form a second polysilicon stud 34 in the deep trench structure 11 on the first polysilicon stud 29. The formation of the collar oxide is known in the art. For example, a CVD oxide film (not shown) is deposited on the interior surface of the deep trench structure 11. The CVD oxide film is then etched back.

As shown in FIG. 6, the exposed collar oxide layer 32, which is not covered by the second polysilicon stud 34, is removed so as to expose the substrate 10 at the upper portion of the deep trench structure 11 and to form a recess 36 at the top of each deep trench structure 11.

As shown in FIG. 7, a third polysilicon stud 44 is formed in the recess 36. The third polysilicon stud 44, which has a top surface that is lower than the surface of the substrate 10, is formed on the second polysilicon stud 34. A chemical vapor deposition process is performed to deposit a borosilicate glass (BSG) layer 46 on the substrate 10. The BSG layer 46 fills the recess 36.

As shown in FIG. 8, a lithographic process is carried out to form a patterned photoresist layer 48 on the BSG layer 46. The patterned photoresist layer 48 having an opening 50 defines the shallow trench isolation area. The pattern of the photoresist layer 48 is then transferred to the underlying BSG layer 46 and the pad nitride layer 14 using a conventional anisotropic dry etching process.

As shown in FIG. 9, using the remaining photoresist layer 48 and the BSG layer 46 as an etch hard mask, an anisotropic dry etching process is carried out to etch the pad oxide layer 12, the substrate 10, the third polysilicon stud 44, the upper portion of the second polysilicon stud 32, and the upper portion of the collar oxide layer 32 through the opening 50, thereby forming an STI opening 52.

As shown in FIG. 10, after removing the remaining BSG layer 46, The STI opening 52 is filled with a high-density plasma (HDP) oxide film 56. Finally, as shown in FIG. 11, a conventional chemical mechanical polishing (CMP) process is carried out to polish the HDP oxide film 56 to a pre-selected thickness.

In general, the above-described prior art method for fabricating a trench capacitor of a DRAM device can be summarized as follows:

Phase 1: deep trench etching.

Phase 2: buried plate and capacitor dielectric formation.

Phase 3: first polysilicon deep trench fill and first recess etching.

Phase 4: collar oxide formation.

Phase 5: second polysilicon deposition and second recess etching.

Phase 6: third polysilicon deposition and third recess etching.

Phase 7: STI process.

It is disadvantageous to use the above-described prior art method for fabricating a trench capacitor of a DRAM device because the prior art processes are complicated and timeconsuming. According to the prior art, it needs three stages of polysilicon deposition (poly 29, 34 and 44) and the following recess etch to complete the capacitor electrode situated within the deep trench. Further, as each capacitor cell area shrinks, the thickness of the collar oxide has negatively affected the effective space for depositing the second polysilicon stud 34, and therefore results in raised capacitor resistance and reduced memory operation performance. In a worst case, the CVD polysilicon cannot be deposited into the deep trench because the thick collar oxide narrows down the dimensions of the upper portion of the deep trench. Moreover, when defining active areas and shallow trench isolation regions, misalignment might cause capacitor disconnection from the pass transistor thereof because signals cannot be transmitted to the storage node through the collar polysilicon stud 34. Furthermore, it is difficult to develop a suitable etchant recipe for etching the complex structure within the STI regions.

Accordingly, there is a strong need for an improved method for making deep trench capacitors of DRAM devices which is not complicated and has good field and reliability.

SUMMARY OF INVENTION

The primary objective of the present invention is to provide a method for manufacturing a deep trench capacitor for a DRAM cell.

According to the claimed invention, a method for fabricating a trench capacitor is disclosed. A semiconductor substrate is provided. The substrate is etched to form a first trench recess with a first depth. A spacer layer is deposited on interior surface of the first trench recess. The spacer layer is anisotropic etched back to form a spacer on sidewall of the first trench recess, and through the first trench recess, continuing to etch the substrate so as to form a second trench recess with a second depth. An oxidation process is performed to form a silicon oxide layer on interior surface not covered by the spacer within the second trench recess. The silicon oxide layer is anisotropic etched to form a self-aligned collar oxide layer on sidewall of the second trench recess, and through the second trench recess, continuing to etch the substrate to form a deep trench recess with a third depth. The deep trench recess is doped to form a diffusion region at a lower portion of the deep trench recess. The diffusion region serves as a first electrode of the trench capacitor. A capacitor dielectric layer is then formed under the self-aligned collar oxide layer on interior surface of the deep trench recess. The deep trench recess is filled with a first conductive layer serving as a second electrode of the trench capacitor. The first conductive layer is then recess etched to form a first conductive stud within the deep trench recess. The first conductive stud has a top surface that is lower than the surface of the substrate, but is higher than the self-aligned collar oxide layer.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
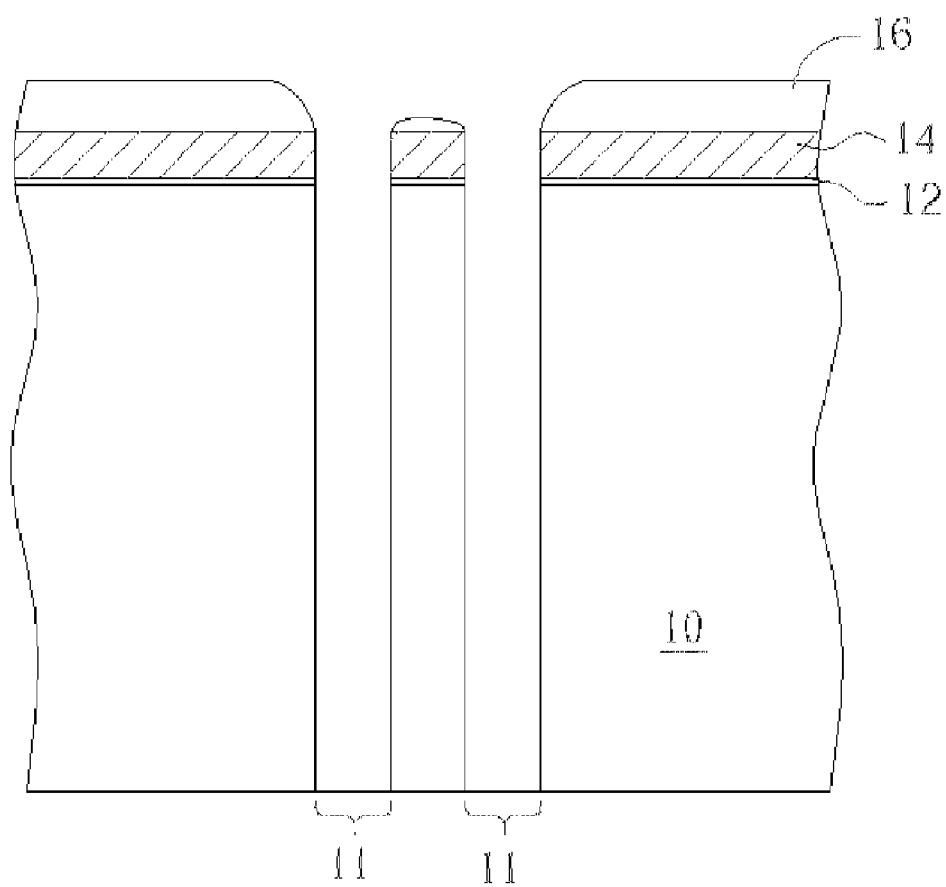
FIG. 1 to FIG. 11 are schematic cross-sectional diagrams showing the fabrication process of the trench capacitor DRAM according to the prior art.
Figure 2:
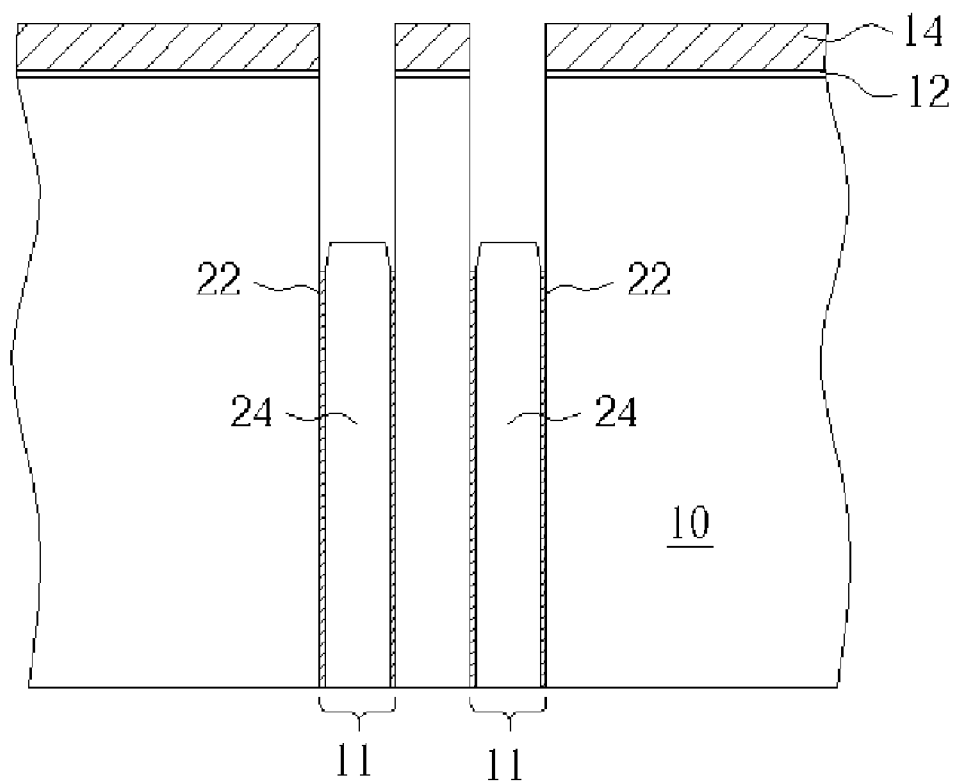
Figure 3:
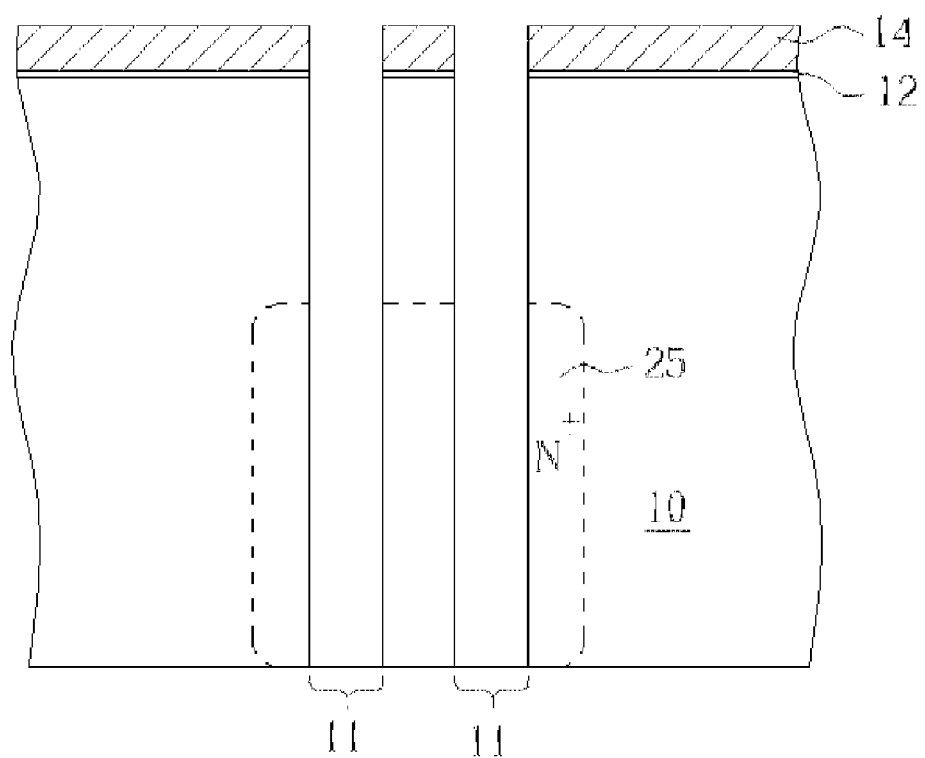
Figure 4:
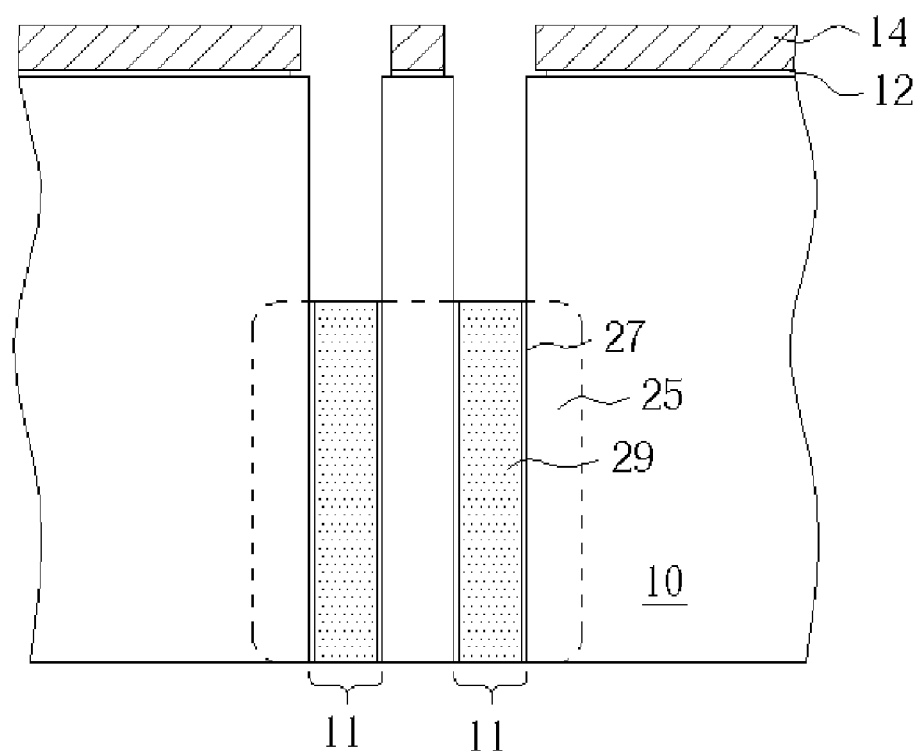
Figure 5:
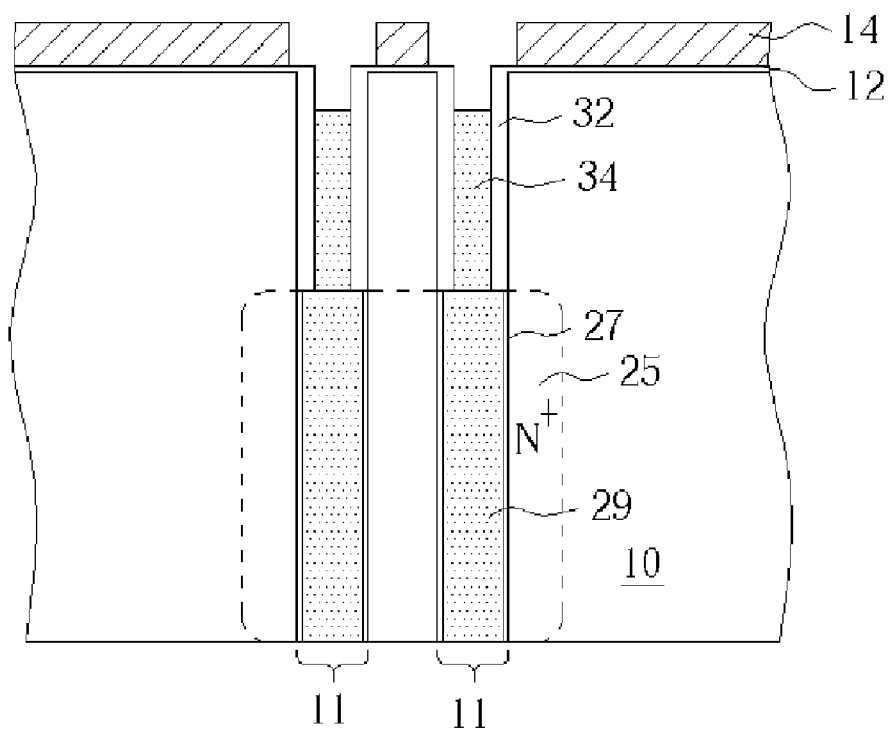
Figure 6:
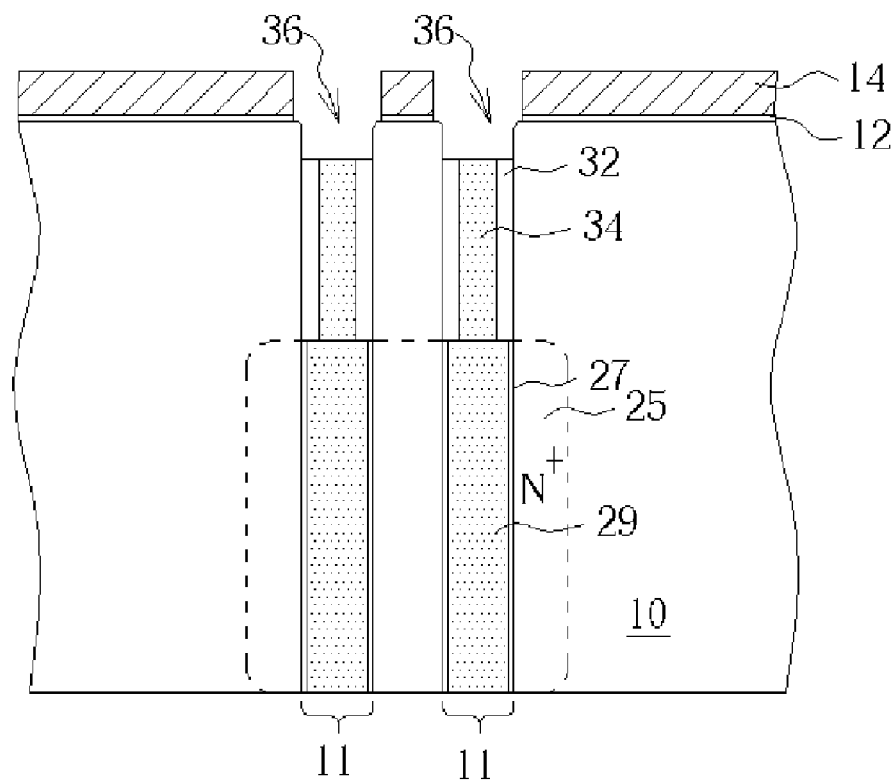
Figure 7:
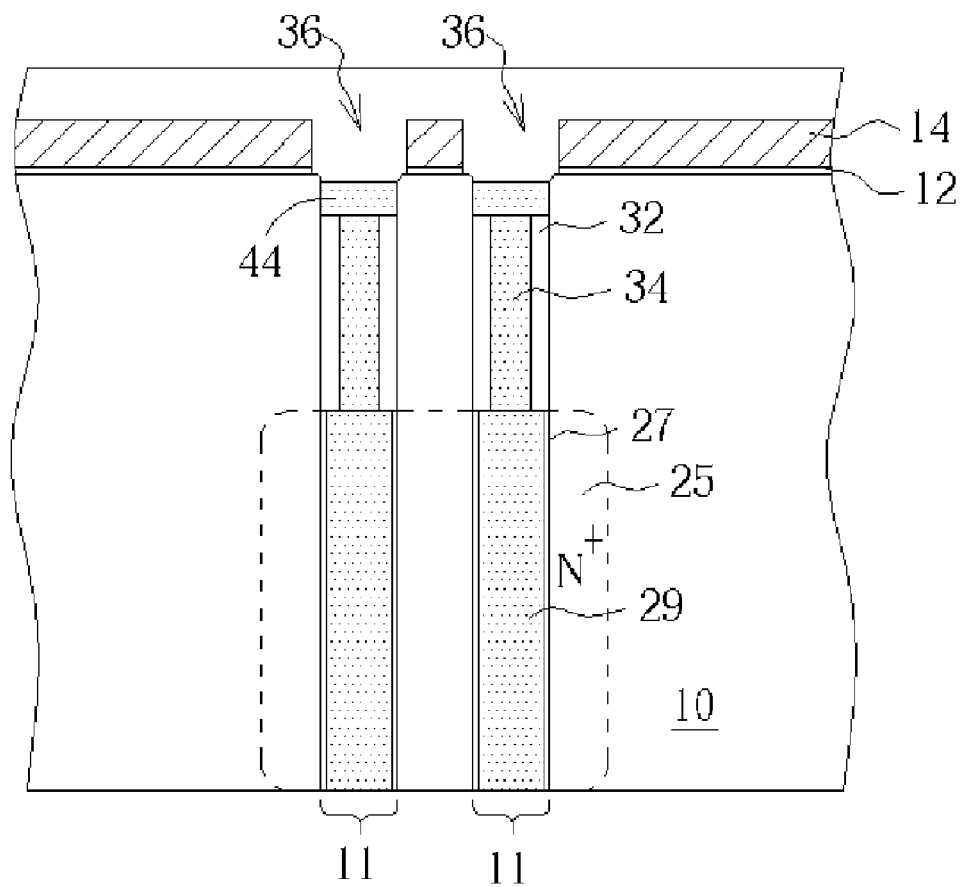
Figure 8:
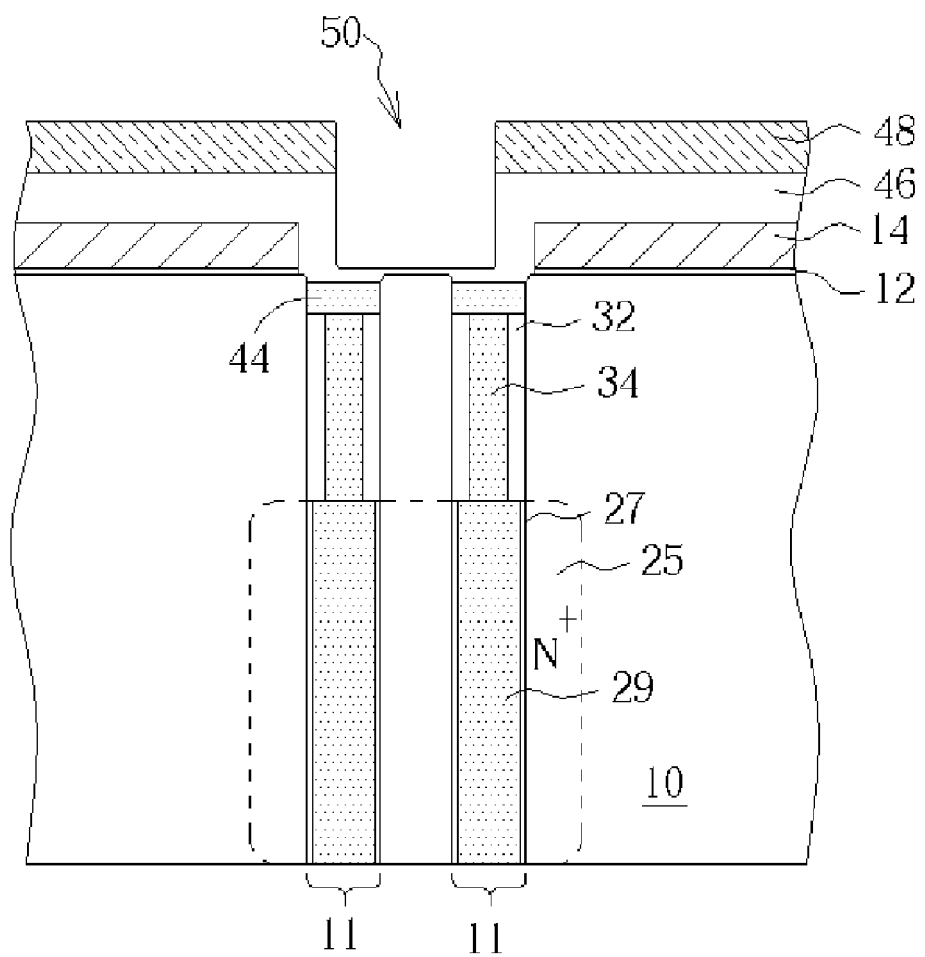
Figure 9:
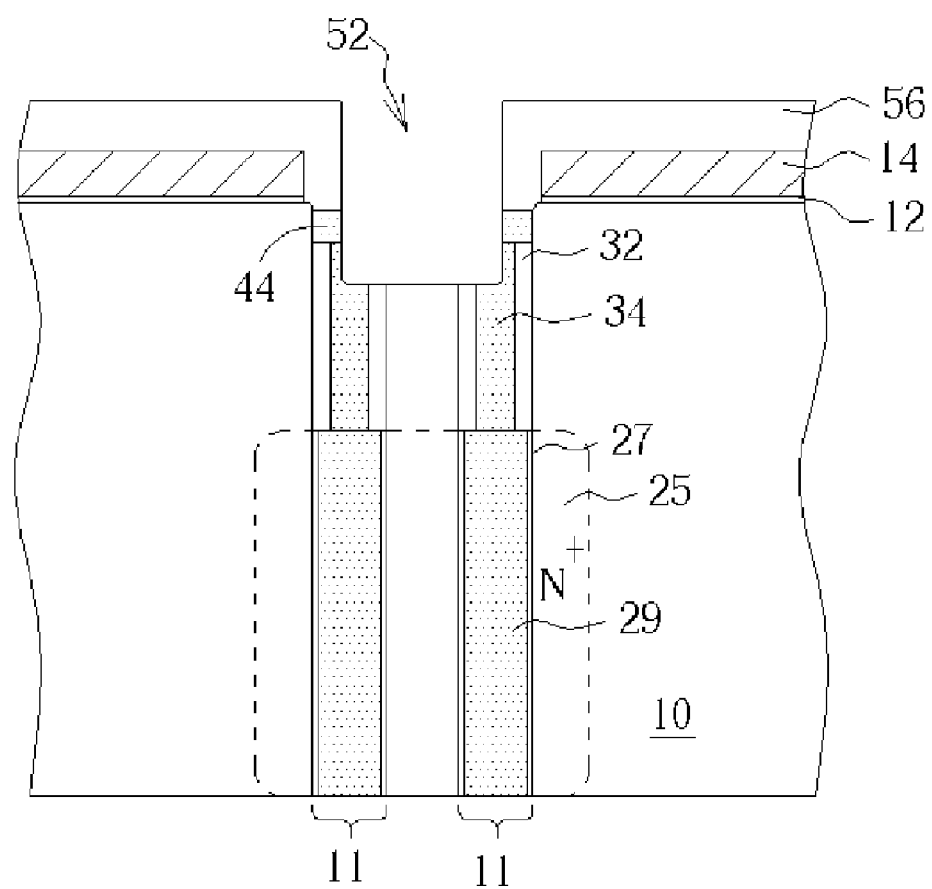
Figure 10:
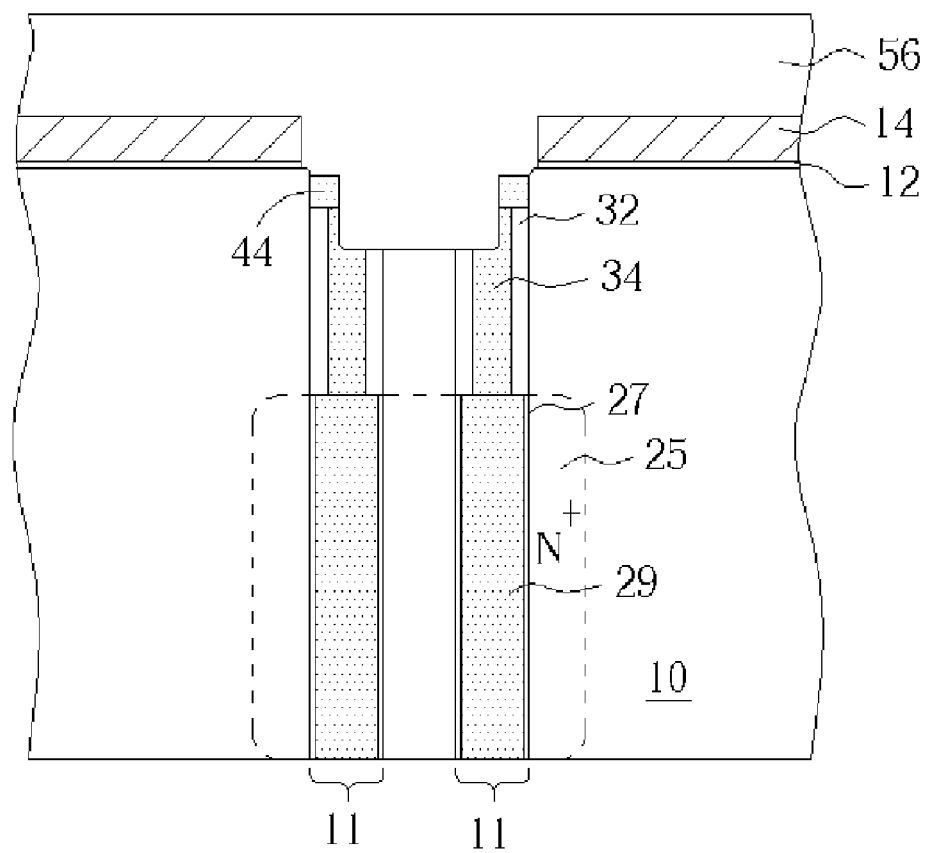
Figure 11:
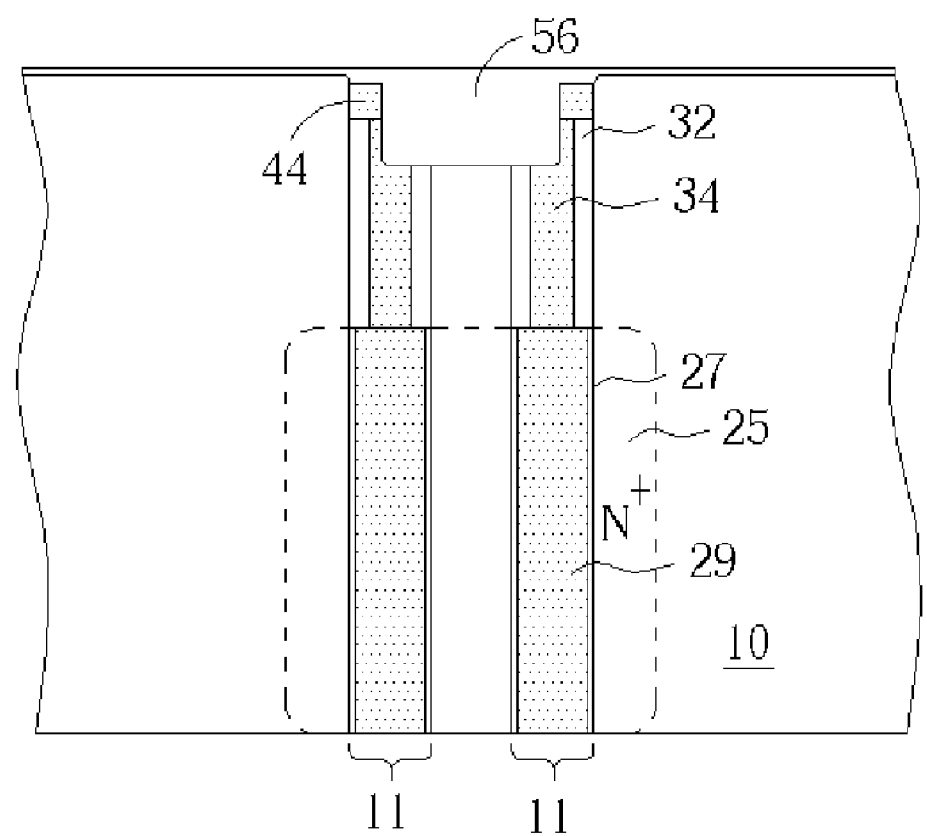
Figure 12:
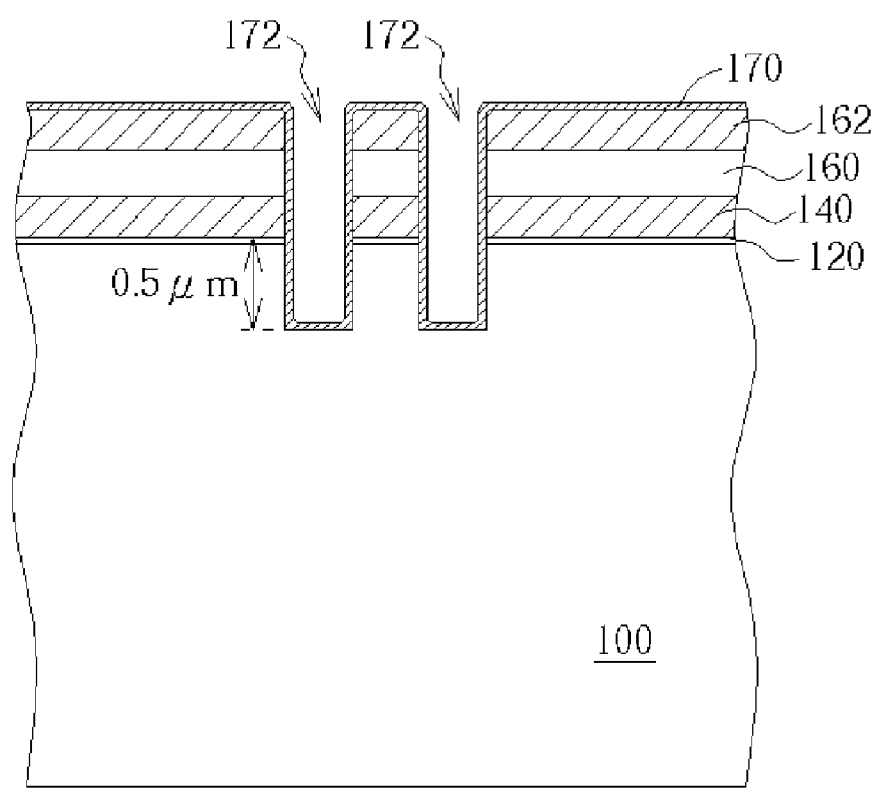
FIG. 12 to FIG. 22 are schematic cross-sectional diagrams showing the fabrication process for making a deep trench capacitor of a DRAM cell according to the first preferred embodiment of this invention.

Please refer to FIG. 12 to FIG. 22. FIG. 12 to FIG. 22 are schematic cross-sectional diagrams showing the fabrication process for making a deep trench capacitor of a DRAM cell. First, as shown in FIG. 12, a semiconductor substrate 100 such as a silicon substrate is provided. A pad oxide layer 120, a pad nitride layer 140, a borosilicate glass (BSG) layer 160, and a silicon nitride layer 162 are sequentially formed on a main surface of the semiconductor substrate 100. The BSG layer 160 serves as an etching hard mask and is relatively thinner comparing to the prior art. A conventional lithographic and etching processes are carried out to form a trench recess 172 in the silicon nitride layer 162, BSG layer 160, pad nitride layer 140, pad oxide layer 120, and the substrate 100. In accordance with the preferred embodiment of the present invention, the depth of the trench recess 172 is about 0.2~0.8 micrometers, preferably 0.5 micrometers, below the surface of the substrate 100. A thin CVD silicon nitride spacer layer 170 having a thickness of about 30~50 angstroms, preferably 40 angstroms, is deposited on the interior surfaces of the trench recess 172.

Figure 13:
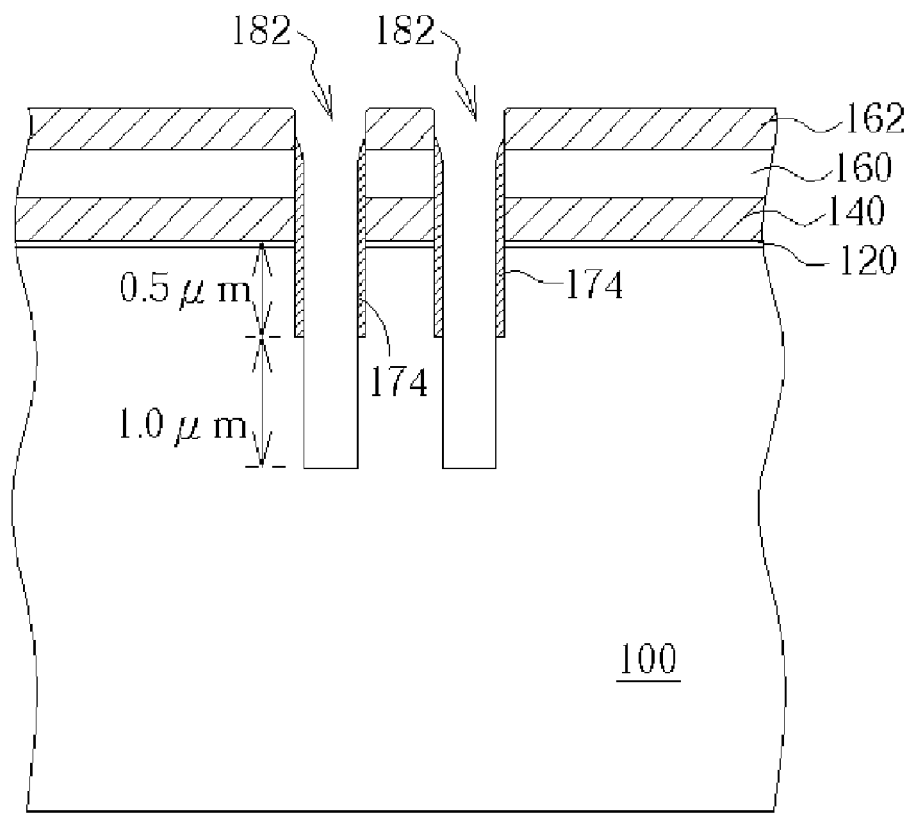

As shown in FIG. 13, an anisotropic dry etching is performed to etch the silicon nitride spacer layer 170. After etching through the silicon nitride spacer layer 170 at the bottom of the trench recess 172, a silicon nitride spacer 174 is formed on the sidewall of the trench recess 172. Using the silicon nitride layer 162 as an etching hard mask, the anisotropic dry etching continues to etch the exposed substrate 100 through the open bottom of the trench recess 172 to a predetermined depth so as to form a trench recess 182. In accordance with the preferred embodiment, as specifically indicated, the predetermined depth of the trench recess 182 is about 0.8~1.5 micrometers, preferably about 1.0 micrometer, below the lower end of the sidewall spacer 174. It is noted that the depth of the trench recess 182 is substantially equal to the length of the capacitor collar oxide that will be formed in the following steps.

Figure 14:
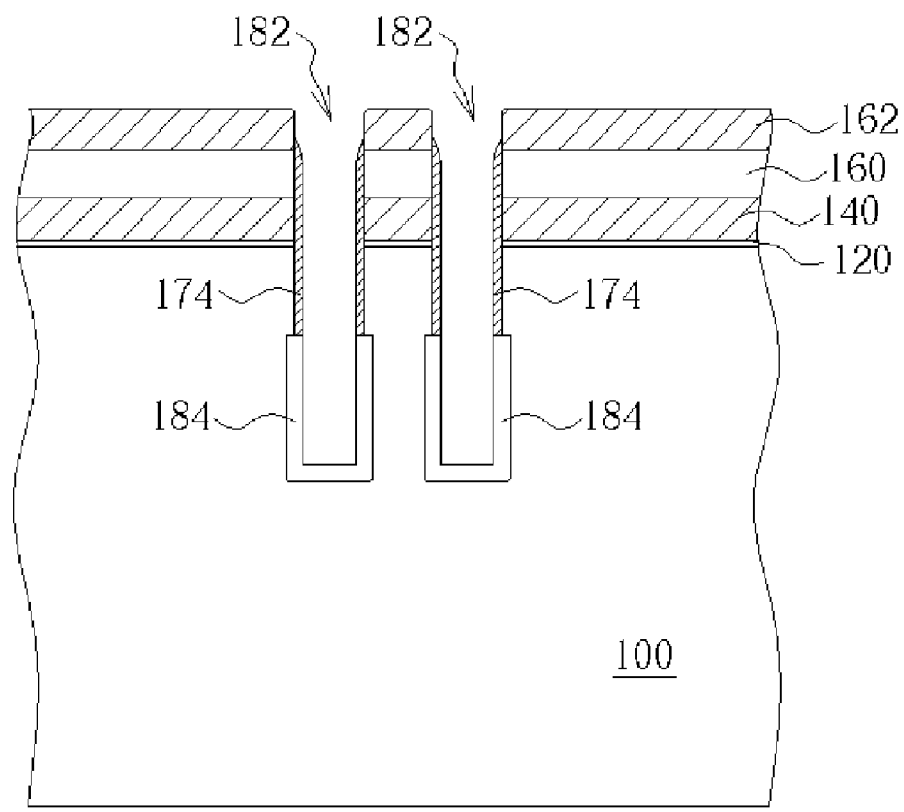

As shown in FIG. 14, an oxidation process is performed to grow a silicon dioxide layer 184 on the exposed silicon surfaces within the trench recess 182. Preferably, the thickness of the silicon dioxide layer 184 is about 30~900 angstroms, more preferably 100~600 angstroms. The oxidation process may be oxygen thermal oxidation, wet oxidation, hydrogen peroxide oxidation, ozone oxidation, or the like.

Figure 15:
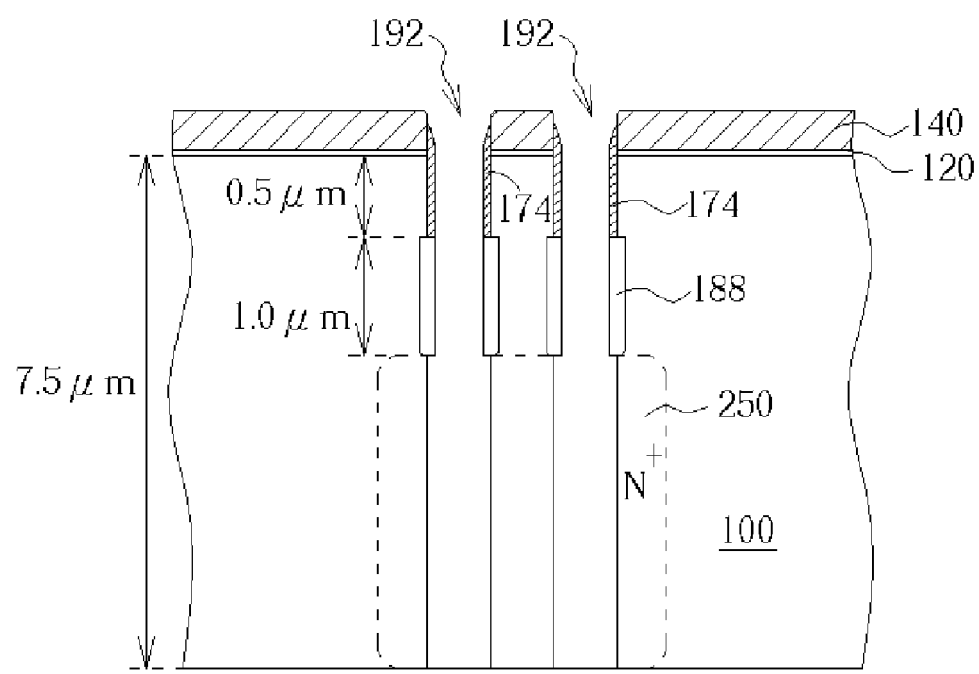

As shown in FIG. 15, using the silicon nitride layer 162 as an etching hard mask, an anisotropic etching process is then carried out to etch the silicon dioxide layer 184 grown at the bottom of the trench recess 182. After etching through the silicon dioxide layer 184 grown at the bottom of the trench recess 182, a self-aligned collar oxide layer 188 is formed on the sidewall of the trench recess 182 under the silicon nitride spacer 174. Subsequently, using the silicon nitride layer 162 and the BSG layer 160 as an etching hard mask, the anisotropic etching continues to etch the exposed substrate 100 through the open bottom of the trench recess 182 to a predetermined depth so as to form a deep trench recess 192. In accordance with the preferred embodiment, as specifically indicated, the predetermined depth of the deep trench recess 192 is about 6.0~9.5 micrometers, preferably about 7.5 micrometer, below the surface of the substrate 100. After removing the remaining BSG layer 160, a buried $N^+$ diffusion plate 250 serving as a first electrode of the trench capacitor is formed in the substrate 100 at the lower portion of the deep trench recess 192. The formation of the buried $N^+$ diffusion plate 250 is known in the art. By way of example, an arsenic silicate glass (ASG) layer is coated on the interior surface of the deep trench recess 192, followed by a thermal drive-in process.

Figure 16:
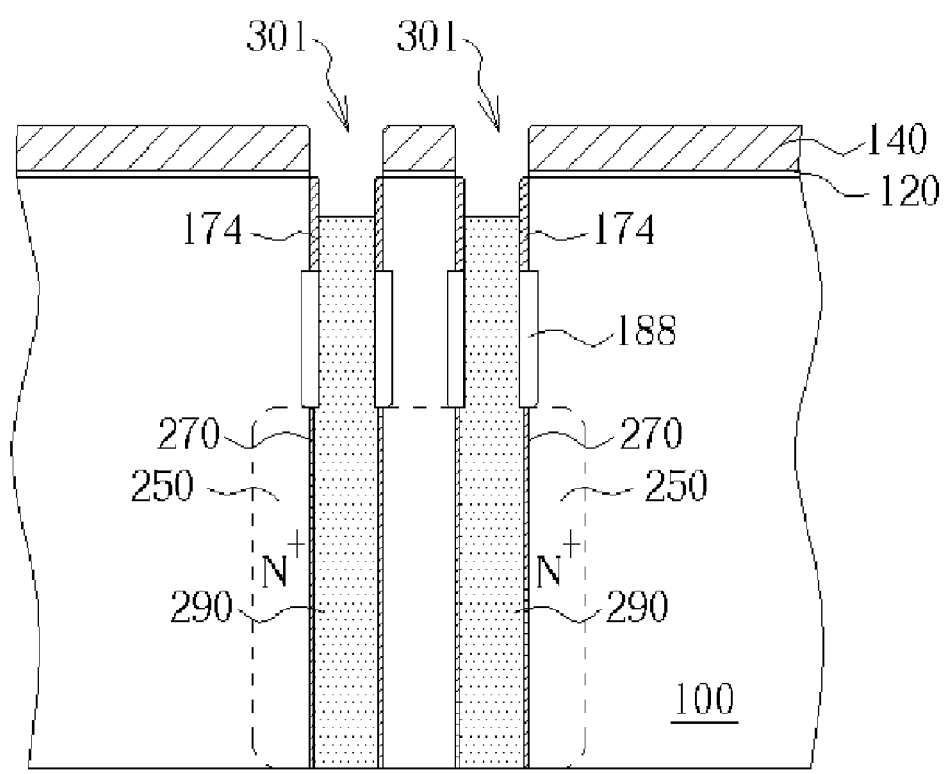

As shown in FIG. 16, a capacitor dielectric layer 270 such as an oxide-nitride (ON) film or an oxide-nitride-oxide (ONO) film, but not limited thereto, is formed on the interior surface of the deep trench recess 192. More specifically, the capacitor dielectric layer 270 is formed on the exposed sidewall of the lower portion of the deep trench recess 192 under the self-aligned collar oxide layer 188 and the bottom of the deep trench recess 192. Subsequently, a chemical vapor deposition (CVD) process such as a low-pressure chemical vapor deposition (LPCVD) is performed to deposit a first polysilicon layer over the substrate 100. The first polysilicon layer (not explicitly shown), which may be an in-situ doped polysilicon layer, fills the deep trench recess 192 and covers the pad nitride layer 140. Using the pad nitride layer 140 as an etching hard mask, a first recess etching process (anisotropic dry etching) is then carried out to etch back the first polysilicon layer so as to form a first polysilicon stud 290 and a first recess 301. The top surface of the first polysilicon layer 290 is lower than the surface of the substrate 100 by about 1500~2500 angstroms. As specifically indicated in the FIG. 16, it is worthy noted that the top surface of the first polysilicon layer 290 is higher than the upper end of the self-aligned collar oxide layer 188.

Figure 17:
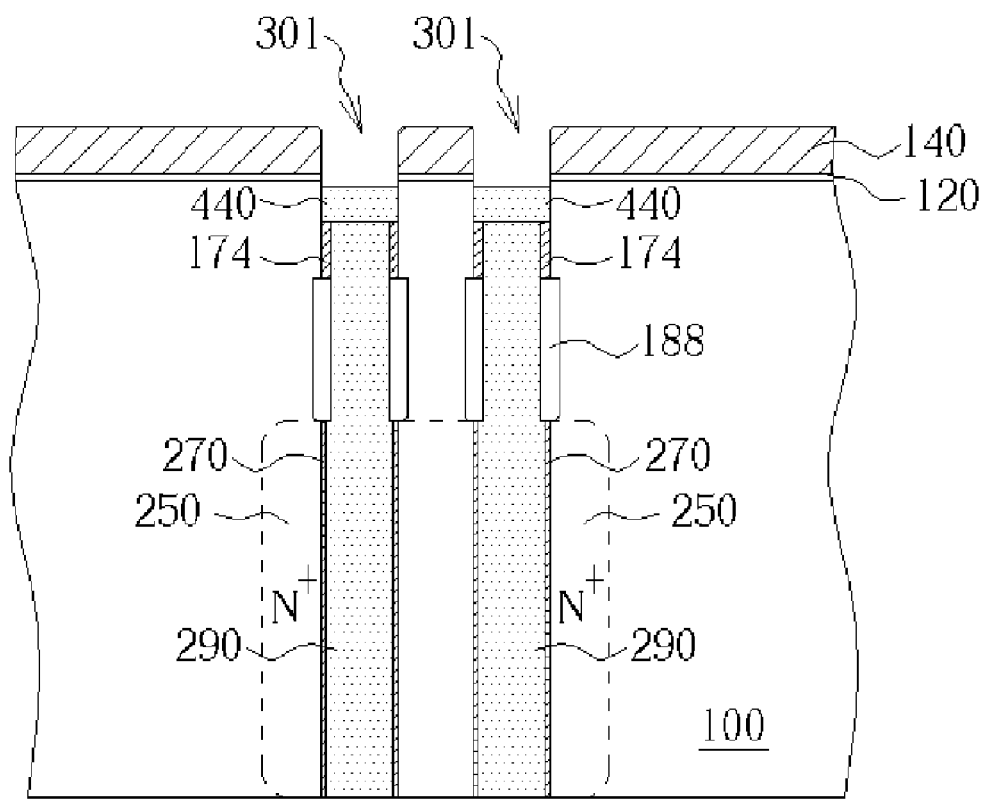

As shown in FIG. 17, the silicon nitride spacer 174 that is not covered by the first polysilicon stud 290 is stripped off by methods known in the art such as wet etching, thereby exposing the substrate 100 at the upper portion of the deep trench structure. A second polysilicon deposition and second recess etch are carried out to form a second polysilicon stud 440 in the first recess 301. The formation of the second polysilicon stud 440 is known in the art. A CVD polysilicon layer is deposited and then etched back to a depth so that the top surface of the second polysilicon stud 440 is lower than the surface of the substrate 100 by at least 500 angstroms for example. In another case, the second polysilicon stud 440 may be replaced with amorphous silicon.

Figure 18:
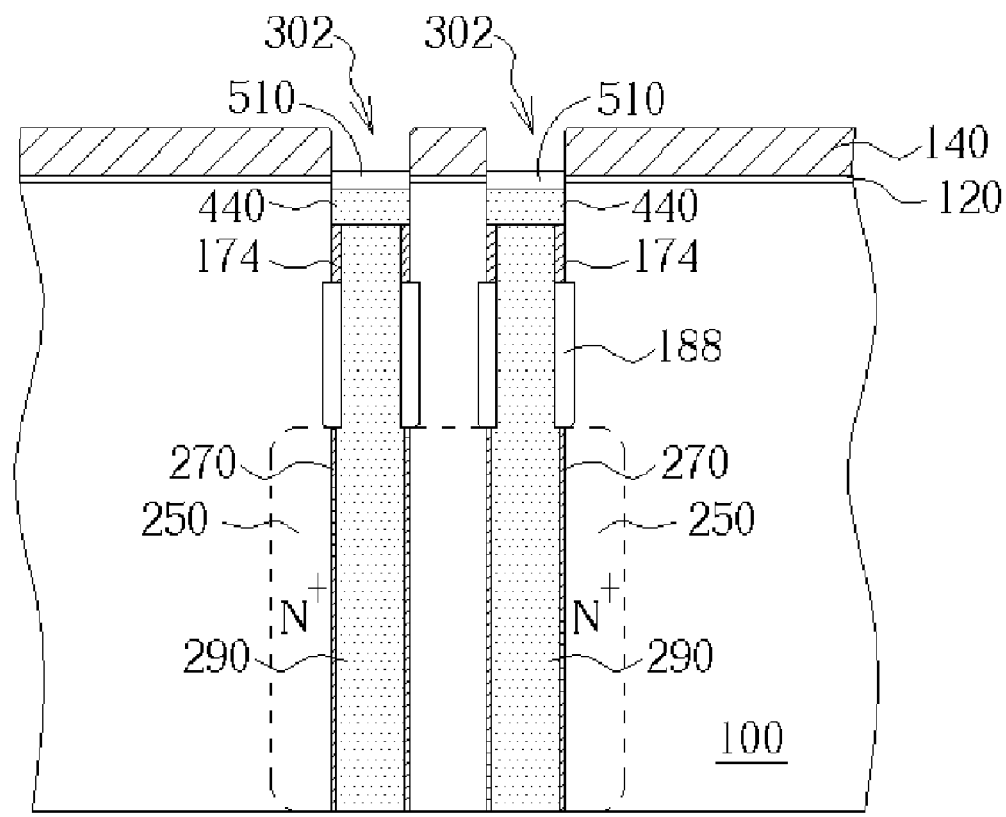

As shown in FIG. 18, a trench top oxide (TTO) layer 510 is deposited on the second polysilicon stud 440 for isolating the capacitor electrode from the overlying word lines (not shown). To form the TTO layer 510, a CVD oxide layer (not shown) is deposited over the substrate 100 to fill the recess 301 and cover the pad nitride layer 140, followed by etching back the CVD oxide layer to a depth so that the top surface of the remaining oxide layer in the recess 301 is lower than the surface of the pad nitride layer 140 and thus forming a recess 302.

Figure 19:
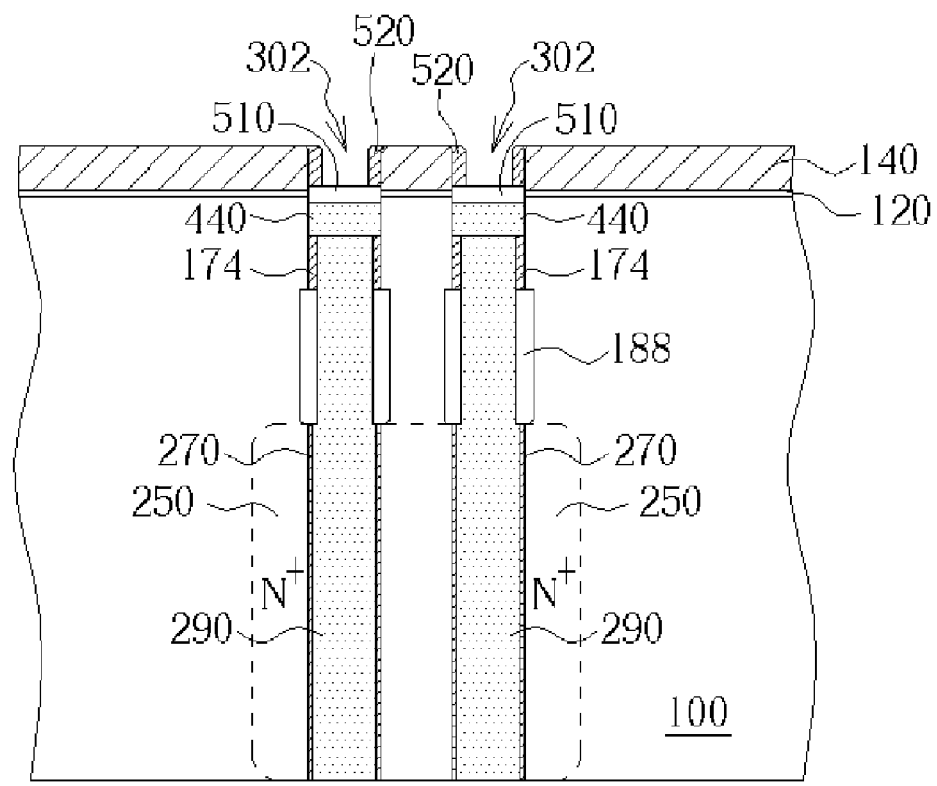

As shown in FIG. 19, a thin silicon nitride layer (not shown) is deposited on the sidewall of the recess 302, the top surface of the TTO layer 510, and the surface of the pad nitride layer 140. Preferably, the thickness of the thin silicon nitride layer is about 20~60 angstroms. An anisotropic etching back process is performed to etch the thin silicon nitride layer so as to form a nitride spacer 520 on the sidewall of the recess 302.

Figure 20:
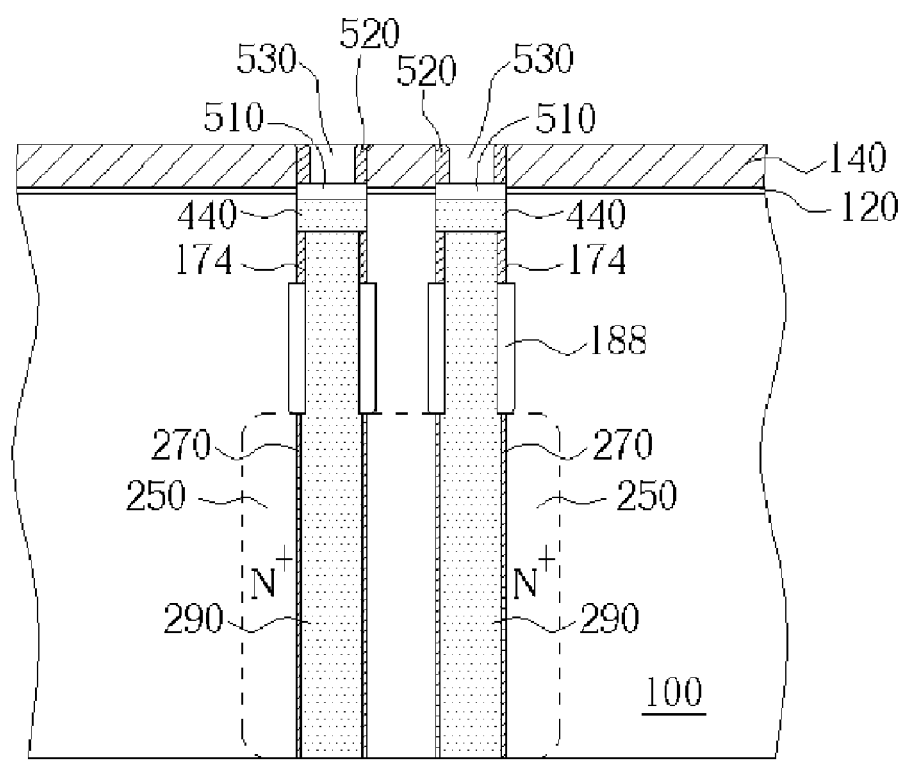

As shown in FIG. 20, a silicon oxide layer 530 is formed within the recess 302. The formation of the silicon oxide layer 530 involves the deposition of a CVD oxide layer (not shown), followed by a planarization process such as a chemical mechanical polishing (CMP) process.

Figure 21:
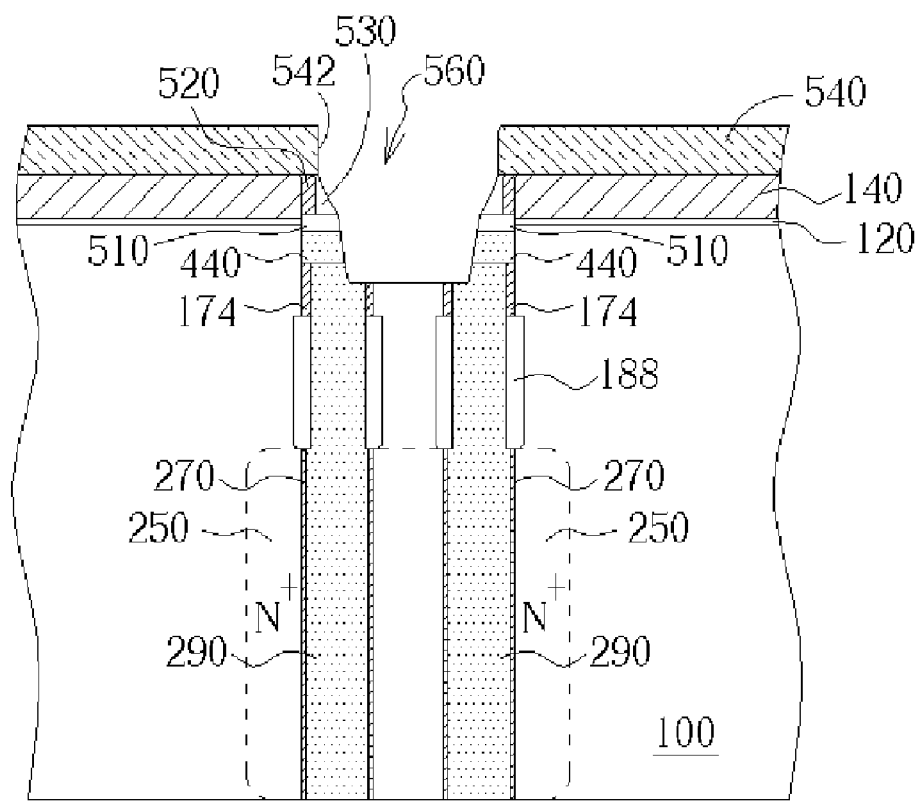

As shown in FIG. 21, subsequently, a conventional lithographic process is carried out. A patterned photoresist layer 540 is formed on the pad nitride layer 140. The patterned photoresist layer 540 has an opening 542 defining the shallow trench isolation region. Using the photoresist layer 540 as an etch hard mask, a plasma dry etching process (STI etching) such as a reactive ion etch (RIE) is then performed to etch the pad nitride layer 140, nitride spacer 520, pad oxide layer 120, substrate 100, a portion of the second polysilicon stud 440, and a portion of the first polysilicon stud 290 through the opening 542. As specifically indicated in FIG. 21, during the STI etching, a portion of the silicon oxide layer 530, a portion of the TTO layer 510 and an small upper portion of the silicon nitride spacer 174 are also removed, thereby forming an STI recess 560. It is worthy noted that the STI etching etches through the entire thickness of the second polysilicon stud 440 and then stops on the first polysilicon stud 290 and the silicon nitride spacer 174, leaving the subjacent collar oxide layer 188 intact. The present invention also features its STI etching process as set forth in FIG. 21. Since the STI etching uses an etch recipe that the etching rate of silicon nitride and silicon is slightly greater than the etching rate of the silicon oxide, the pad nitride layer 140 and the nitride spacer 520 are etched selective to the adjoining silicon oxide layer 530 and TTO layer 510, thereby forming a self-aligned STI recess 560 having a bowl-shaped upper cross section. This facilitates the following STI insulation fill. Further, since the STI etching according to this invention does not involve the etch of the collar oxide layer, the development of etchant recipe becomes easier than prior art.

Figure 22:
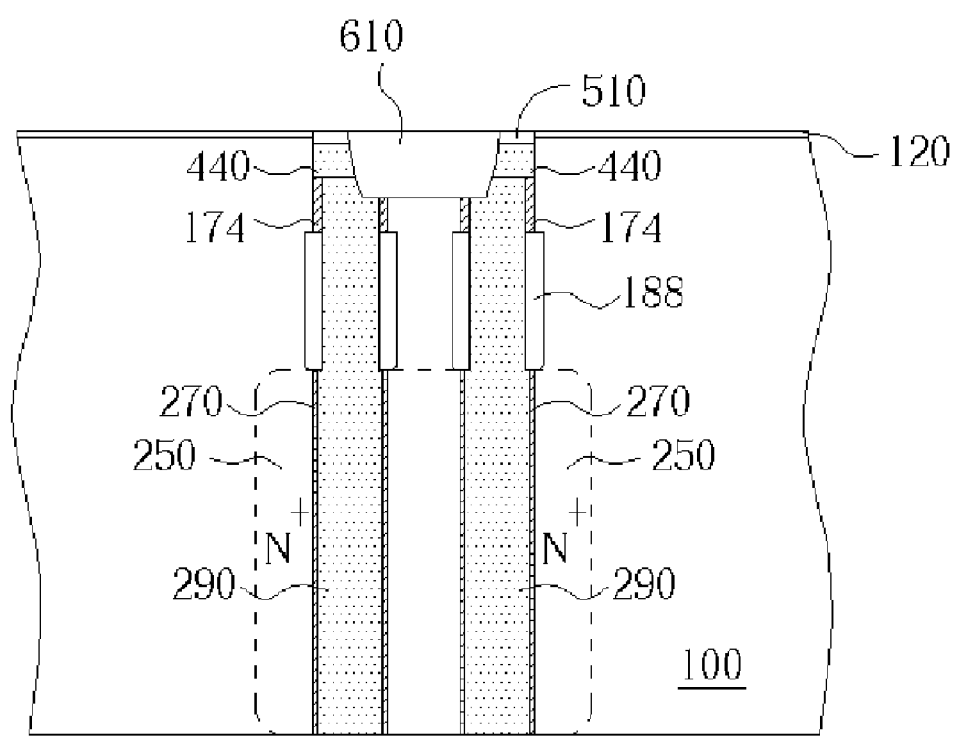

As shown in FIG. 22, after stripping the photoresist layer 540, a high-density plasma chemical vapor deposition (HDP CVD) process is carried out to deposit a HDP oxide layer 610 over the substrate 100. The HDP oxide layer 610 fills the STI recess 560. Finally, using the pad nitride layer 140 as a polish stop layer, a chemical mechanical polishing is performed to planarize the HDP oxide layer 610 so as to obtain a planar substrate surface.

Figure 23:
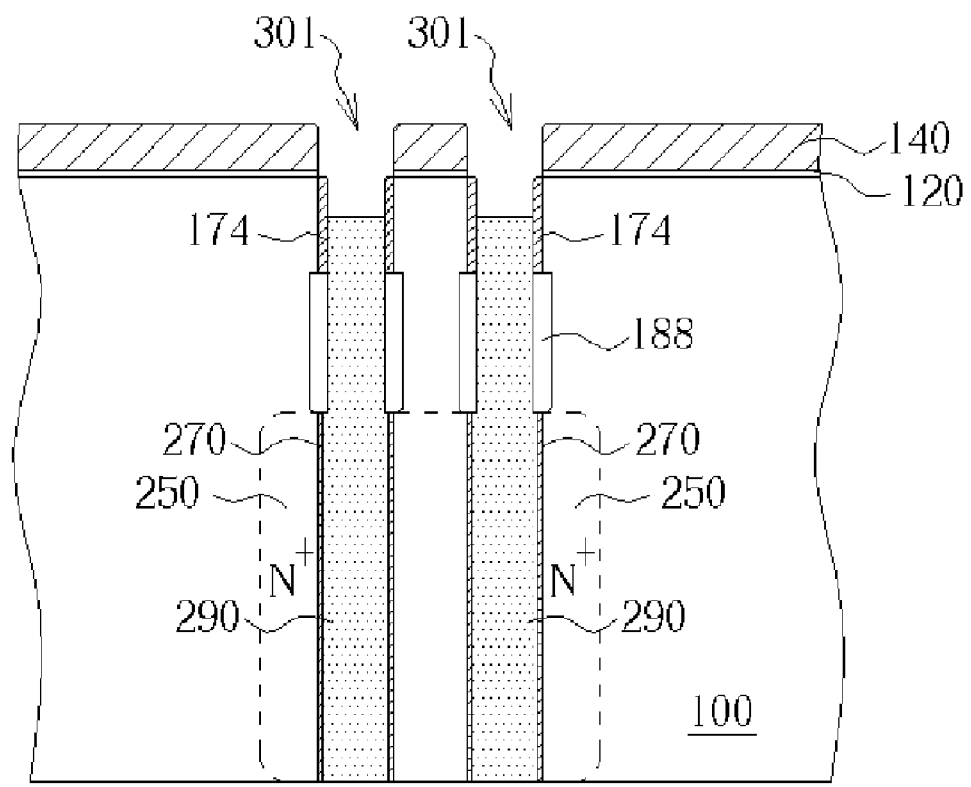
FIG. 23 to FIG. 25 are schematic cross-sectional diagrams illustrating the steps for fabricating a deep trench capacitor according to the second preferred embodiment of this invention.
Figure 24:
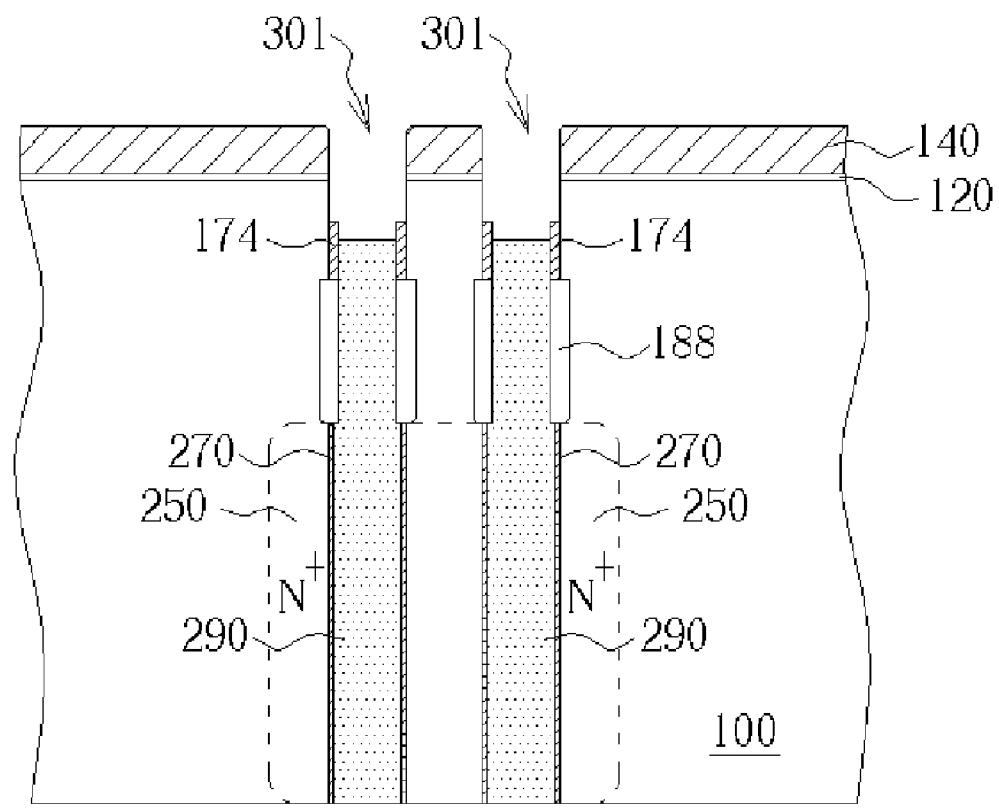
Figure 25:
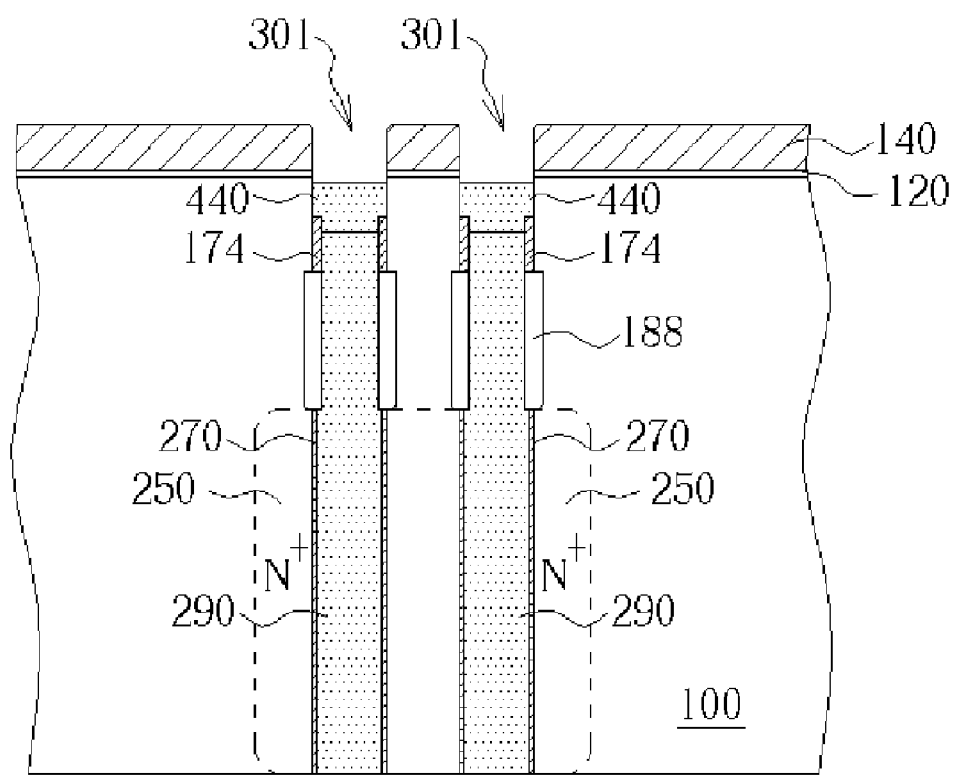

Please refer to FIG. 23 to FIG. 25. FIG. 23 to FIG. 25 are schematic cross-sectional diagrams illustrating the steps for fabricating a deep trench capacitor according to the second preferred embodiment of this invention, wherein like numerals designate like elements or regions. The intermediate capacitor structure as set forth in FIG. 23 is the same as the capacitor structure depicted in FIG. 16, and can be fabricated using the steps as illustrated through FIG. 12 to FIG. 16. As shown in FIG. 23, likewise, the capacitor dielectric 270 is formed. A first polysilicon layer 290 is then deposited and recessed (etched back) to expose a portion of the silicon nitride spacer 174. The exposed top surface of the remaining first polysilicon layer 290 is below the surface of the substrate 100, thereby forming a recess 301.

As shown in FIG. 24, the exposed silicon nitride spacer 174 that is not covered by the remaining first polysilicon layer 290 within the recess 301 is stripped off using a method known in the art, for example, hot phosphoric acid. Next, the first polysilicon layer 290 is subjected to a second etching back process to recess the top surface of the first polysilicon layer 290 to a lower level. According to the second preferred embodiment of the invention, a top portion of the first polysilicon layer 290 with a thickness of about 500~2000 angstroms, preferably 1000 angstroms, is removed. An upper portion of the remaining silicon nitride spacer 174 is exposed.

As shown in FIG. 25, a CVD polysilicon deposition and recess etch are carried out to form a second polysilicon stud 440 in the first recess 301. The formation of the second polysilicon stud 440 is known in the art. A CVD polysilicon layer is deposited and then etched back to a depth so that the top surface of the second polysilicon stud 440 is 100~500 angstroms lower than the surface of the substrate 100 for example. Since an extra thickness of the first polysilicon layer 290 is etched away, about 100 angstroms in this embodiment, the diffusion path for the dopants of the first polysilicon layer 290 to the silicon substrate 100 is thus elongated. This facilitates the shrinkage of deep trench capacitor devices because the junction depth of the buried strap out diffusion that will be formed in the following thermal process is suppressed to an acceptable range. After the formation of the second polysilicon stud 440, the substrate 100 or wafer is subjected to STI process, which are steps as illustrated through FIG. 18 to FIG. 22, and are therefore omitted for the sake of simplicity.

From above, the method for fabricating a trench capacitor of a DRAM device according to the present invention can be summarized as follows:

Phase 1: first trench recess etching and sidewall spacer forming (FIG. 12 and FIG. 13).

Phase 2: second trench recess etching and self-aligned collar oxide layer forming (FIG. 13 to FIG. 15).

Phase 3: deep trench recess etching and buried plate forming (FIG. 15).

Phase 4: capacitor dielectric layer forming and first polysilicon deep trench fill/first recess etching (FIG. 16).

Phase 5: second polysilicon deep trench fill/second recess etching (FIG. 17).

Phase 6: TTO layer forming (FIG. 18).

Phase 7: self-aligned STI process (FIG. 19 to FIG. 22).

In contrast to the prior art method, the present invention method only involves two stages of polysilicon deposition (polysilicon studs 290 and 440) and recess etch thereof. The fabrication process is simplified and is therefore more cost-effective. Further, the formation of the collar oxide layer of the trench capacitor structure of this invention is self-aligned and is done prior to the deposition of the first polysilicon layer. Above the collar oxide layer 188, there is situated a silicon nitride spacer 174, and therefore the second polysilicon stud does not contact with the collar oxide layer 188. Furthermore, the trench top oxide layer 510 is formed right after the formation of the second polysilicon stud 440. The capacitor resistance at its collar portion is reduced since the space for accommodating the polysilicon layer 290 is increased due to that the thin silicon nitride spacer 174 and thermally formed collar oxide layer 188. Moreover, the STI process of the present invention is also self-aligned. A self-aligned STI recess 560 having a bowl-shaped upper cross section is created after the STI etching. This facilitates the following STI insulation fill.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A method for fabricating a trench capacitor, comprising:
providing a substrate;
etching the substrate to form a first trench recess with a first depth;
depositing a spacer layer on interior surface of the first trench recess;
anisotropic etching the spacer layer to form a spacer on sidewall of the first trench recess, and through the first trench recess, continuing to etch the substrate so as to form a second trench recess with a second depth;
performing an oxidation process to form a silicon oxide layer on interior surface not covered by the spacer within the second trench recess;
anisotropic etching the silicon oxide layer to form a self-aligned collar oxide layer on sidewall of the second trench recess, and through the second trench recess, continuing to etch the substrate to form a deep trench recess with a third depth;
doping the deep trench recess to form a diffusion region at a lower portion of the deep trench recess, the diffusion region serving as a first electrode of the trench capacitor;
forming a capacitor dielectric layer under the self-aligned collar oxide layer on interior surface of the deep trench recess;
filling the deep trench recess with a first conductive layer serving as a second electrode of the trench capacitor; and
recess etching the first conductive layer to form a first conductive stud within the deep trench recess, the first conductive stud has a top surface that is lower than the surface of the substrate, but is higher than the self-aligned collar oxide layer.

2. The method of claim 1 wherein after recess etching the first conductive layer, the method further comprises the following steps:
removing the spacer that is not covered by the first conductive stud;
depositing a second conductive layer on the first conductive stud;
recess etching the second conductive layer to form a second conductive stud having a top surface that is lower than the surface of the substrate; and
depositing a trench top oxide (TTO) layer on the second conductive stud.

3. The method of claim 2 wherein the first conductive stud is made of doped polysilicon.

4. The method of claim 2 wherein the second conductive layer is made of doped polysilicon.

5. The method of claim 1 wherein the first depth is about 0.2~0.8 micrometers.

6. The method of claim 5 wherein the first depth is about 0.5 micrometers.

7. The method of claim 1 wherein the second depth is about 0.8~1.5 micrometers.

8. The method of claim 7 wherein the second depth is about 1.0 micrometers.

9. The method of claim 1 wherein the third depth is about 6.0~9.5 micrometers.

10. The method of claim 9 wherein the third depth is about 7.5 micrometers.

11. The method of claim 1 wherein the spacer layer is made of silicon nitride.

12. The method of claim 1 wherein the spacer has a thickness of about 30~50 angstroms.

13. The method of claim 1 wherein the capacitor dielectric layer is an oxide-nitride-oxide (ONO) film.

14. A method for fabricating a trench capacitor, comprising:
  providing a substrate having thereon a pad layer, a first etch stop layer on the pad layer, and a second etch stop layer on the first etch stop layer;
  etching second etch stop layer, the first etch stop layer, the pad layer, and the substrate to form a first trench recess with a first depth in the substrate;
  depositing a spacer layer on interior surface of the first trench recess and on the second etch stop layer;
  anisotropic etching the spacer layer to form a spacer on sidewall of the first trench recess, and through the first trench recess, continuing to etch the substrate so as to form a second trench recess with a second depth;
  performing an oxidation process to form a silicon oxide layer on interior surface not covered by the spacer within the second trench recess;
  anisotropic etching the silicon oxide layer, using the first etch stop layer and the second etch stop layer as an etch hard mask, to form a self-aligned collar oxide layer on sidewall of the second trench recess, and through the second trench recess, continuing to etch the substrate to form a deep trench recess with a third depth;
  removing a remaining first etch stop layer;
  doping the deep trench recess to form a diffusion region at a lower portion of the deep trench recess, the diffusion region serving as a first electrode of the trench capacitor;
  forming a capacitor dielectric layer under the self-aligned collar oxide layer on interior surface of the deep trench recess;
  filling the deep trench recess with a first conductive layer serving as a second electrode of the trench capacitor; and
  recess etching the first conductive layer to form a first conductive stud within the deep trench recess, the first conductive stud has a top surface that is lower than the surface of the substrate, but is higher than the self-aligned collar oxide layer.

15. The method of claim 14 wherein after recess etching the first conductive layer, the method further comprises the following steps:
  removing the spacer that is not covered by the first conductive stud;
  depositing a second conductive layer on the first conductive stud;
  recess etching the second conductive layer to form a second conductive stud having a top surface that is lower than the surface of the substrate;
  depositing a trench top oxide (TTO) layer on the second conductive stud, the TTO layer's top surface and sidewall of the pad layer constitute a recess;
  forming a nitride spacer on sidewall of the recess; and
  filling the recess with a silicon oxide layer that is substantially coplanar with the adjoining pad layer.

16. The method of claim 15 wherein the first conductive stud is made of doped polysilicon.

17. The method of claim 15 wherein the second conductive layer is made of amorphous silicon.

18. The method of claim 14 wherein the spacer layer is made of silicon nitride.

19. The method of claim 14 wherein the spacer has a thickness of about 30~50 angstroms.

20. The method of claim 14 wherein the first depth is about 0.2~0.8 micrometers.

21. The method of claim 14 wherein the second depth is about 0.8~1.5 micrometers.

22. The method of claim 14 wherein the third depth is about 6.0~9.5 micrometers.

* * * * *

UNITED STATES PATENT AND TRADEMARK OFFICE
CERTIFICATE OF CORRECTION

PATENT NO. : 6,964,898 B1
DATED : November 15, 2005
INVENTOR(S) : Cheng

It is certified that error appears in the above-identified patent and that said Letters Patent is hereby corrected as shown below:

<u>Title page,</u>
Item [76], Inventor, residence should read -- Hsin-Chu (TW) --.

Signed and Sealed this

Ninth Day of May, 2006

JON W. DUDAS
*Director of the United States Patent and Trademark Office*